United States Patent
Jafarian-Tehrani

(10) Patent No.: US 9,312,832 B2
(45) Date of Patent: Apr. 12, 2016

(54) HIGH POWER FILTER WITH SINGLE ADJUST FOR MULTIPLE CHANNELS

(71) Applicant: Lam Research Corporation, Fremont, CA (US)

(72) Inventor: Seyed Jafar Jafarian-Tehrani, Fremont, CA (US)

(73) Assignee: Lam Research Corporation, Fremont, CA (US)

(*) Notice: Subject to any disclaimer, the term of this patent is extended or adjusted under 35 U.S.C. 154(b) by 114 days.

(21) Appl. No.: 14/339,295

(22) Filed: Jul. 23, 2014

(65) Prior Publication Data

US 2016/0028362 A1    Jan. 28, 2016

(51) Int. Cl.
*H03G 11/04* (2006.01)
*H04B 3/04* (2006.01)
*H03H 7/06* (2006.01)
*H03H 7/01* (2006.01)

(52) U.S. Cl.
CPC ............... *H03H 7/06* (2013.01); *H03H 7/0138* (2013.01); *H03H 7/0153* (2013.01)

(58) Field of Classification Search
CPC ...... H03H 7/06; H03H 7/0138; H03H 7/0153
USPC ............................................. 333/17.1, 99 PL
See application file for complete search history.

(56) References Cited

U.S. PATENT DOCUMENTS

| | | | | |
|---|---|---|---|---|
| 8,547,272 | B2* | 10/2013 | Nestler | H03H 15/02 341/155 |
| 9,178,485 | B2* | 11/2015 | Nardin | H03H 7/0138 |
| 2012/0032756 | A1* | 2/2012 | Long | H01J 37/32174 333/181 |
| 2012/0133459 | A1* | 5/2012 | Zhuang | H04B 3/14 333/28 R |
| 2014/0022030 | A1* | 1/2014 | Wu | H03H 7/01 333/170 |

OTHER PUBLICATIONS

Shen et al.,"Eight-Channel Reconfigurable Microring Filter with Tunable Frequency, Extinction Ratio and Bandwith" 2010 Optical Society, 10 pages.

Martone, Massimiliano (Max), "Cumulant-Based Adaptive Multichannel Filtering for Wireless Communication Systems with Multipath RF Propagation Using Antenna Arrays", IEEE Transactions on Vehicular Technology, vol. 47, No. 2, May 1998, pp. 377-391.

Fikar, et al., "4-Channel/Antenna Multi-Band RF Transmitter Operating from 525 MHz to 6 GHz" BMW Group Research and Technology, 4 pages.

* cited by examiner

*Primary Examiner* — Stephen E Jones
*Assistant Examiner* — Scott S Outten
(74) *Attorney, Agent, or Firm* — Beyer Law Group LLP

(57) ABSTRACT

A RF filter system for filtering radio frequency is provided. A first plurality of capacitors, said first plurality of capacitors comprising at least a first capacitor and a second capacitor is provided. A first conductor and second conductor are wound around a first core member to forma first inductor formed from the first conductor and a second inductor formed from the second conductor, a first end of said first conductor being connected to a first end of a first load and to a first end of said first capacitor, wherein a first end of said second conductor being connected to a second end of the first load and a second end of said second capacitor. A first variable component has a first end connected to ground and a second end connected to a second end of said first capacitor and a first end of said second capacitor.

19 Claims, 5 Drawing Sheets

HIGH POWER FILTER WITH SINGLE ADJUST FOR MULTIPLE CHANNELS

BACKGROUND OF THE INVENTION

The present invention is related to radio frequency (RF) power filters. In particular, the present invention is related to RF power filters for use in plasma processing systems.

Plasma processing systems, such as capacitively coupled plasma (CCP) systems, inductively coupled plasma (ICP) systems, and transformer coupled plasma (TCP) systems, are employed in various industries for fabricating devices on wafers. For example, the industries may include semiconductor, magnetic read/write and storage, optical system, and micro-electromechanical system (MEMS) industries.

A plasma processing system may generate and sustain plasma in a plasma processing chamber to perform etching and/or deposition on a wafer such that device features may be formed on the wafer. The plasma processing system may include an electrostatic chuck (ESC) for supporting the wafer during plasma one or more processing processes. An ESC with zone-to-zone tunable temperature capability may be critical for temperature sensitive plasma processing processes. For minimizing electromagnetic compatibility (EMC) failure, interference issues, and power loss issues that may be caused by RF power transmitted from the ESC and leaked from the plasma processing chamber, an RF power filter may be implemented in the plasma processing system. Such plasma processing systems are disclosed in US Patent Application Publication 2012/0032756, entitled "Radio Frequency (RF) Power Filters And Plasma Processing Systems Including RF Power Filters," by Long et al., filed in Feb. 9, 2012, which is incorporated by reference for all purposes.

SUMMARY OF THE INVENTION

To achieve the foregoing and in accordance with the purpose of the present invention, a RF filter system for filtering radio frequency (RF) power transmitted from at least an electrostatic chuck (ESC) in a plasma processing system, said plasma processing system including at least a first load disposed at a first portion of said ESC, said plasma processing system further including at least a power supply is provided. A first core member is provided. A first plurality of capacitors, said first plurality of capacitors comprising at least a first capacitor and a second capacitor is provided. A first conductor is provided. A second conductor, is provided, where first portions of the first conductor and second conductor are wound around and wound along at least a first portion of said first core member to form at least a first set of inductors comprising a first inductor formed from the first conductor and a second inductor formed from the second conductor, wherein a first set of inductances, a first end of said first conductor being connected to a first end of said first load and to a first end of said first capacitor and a second end of said first conductor being electrically connected to the power supply, wherein a first end of said second conductor being connected to a second end of the first load and a second end of said second capacitor, and wherein a second end of said second conductor being electrically connected to said power supply. A first variable component has a first end connected to ground and a second end connected to a second end of said first capacitor and a first end of said second capacitor.

In another manifestation of the invention, a RF filter system for filtering radio frequency (RF) power transmitted from a load and between the load and a power supply is provided. A first resistor with a first end and a second end is provided, where the first end of the first resistor is electrically connected to a first terminal of the load. A first inductor with a first end and a second end has the first end of the first inductor electrically connected to a second end of the first resistor. A first capacitor has a first end electrically connected to the first end of the first resistor and the first terminal of the load. A second resistor with a first end and a second end has the first end of the second resistor is electrically connected to a second terminal of the load. A second inductor with a first end and a second end has the first end of the second inductor is electrically connected to a second end of the second resistor. A second capacitor has a second end electrically connected to the first end of the second resistor and the second terminal of the load. A first variable component has a first end connected to ground and a second end connected to the second end of said first capacitor and a first end of said second capacitor.

These and other features of the present invention will be described in more detail below in the detailed description of the invention and in conjunction with the following figures.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION OF THE PREFERRED EMBODIMENTS

The present invention will now be described in detail with reference to a few preferred embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps and/or structures have not been described in detail in order to not unnecessarily obscure the present invention.

One or more embodiments of the invention are related to a filter for filtering radio frequency (RF) power transmitted from at least an electrostatic chuck (ESC) in a plasma processing system. The plasma processing system may include a first heating element disposed at a first portion of the ESC and a second heating element disposed at a second portion of the ESC. The plasma processing system may further include a power supply, such an alternating current (AC) power supply, for powering the heating elements. The filter may filter or block RF power from being transmitted in one direction (thereby minimizing EMC failure, interference issues, and/or power loss issues) and may allow low frequency AC power (for example 47 Hz to 63 Hz) to be transmitted in another direction to the heating elements. The filter may include a core member for providing structural support to some components. The core member may be secured inside an enclosure of the filter.

Figure 1:
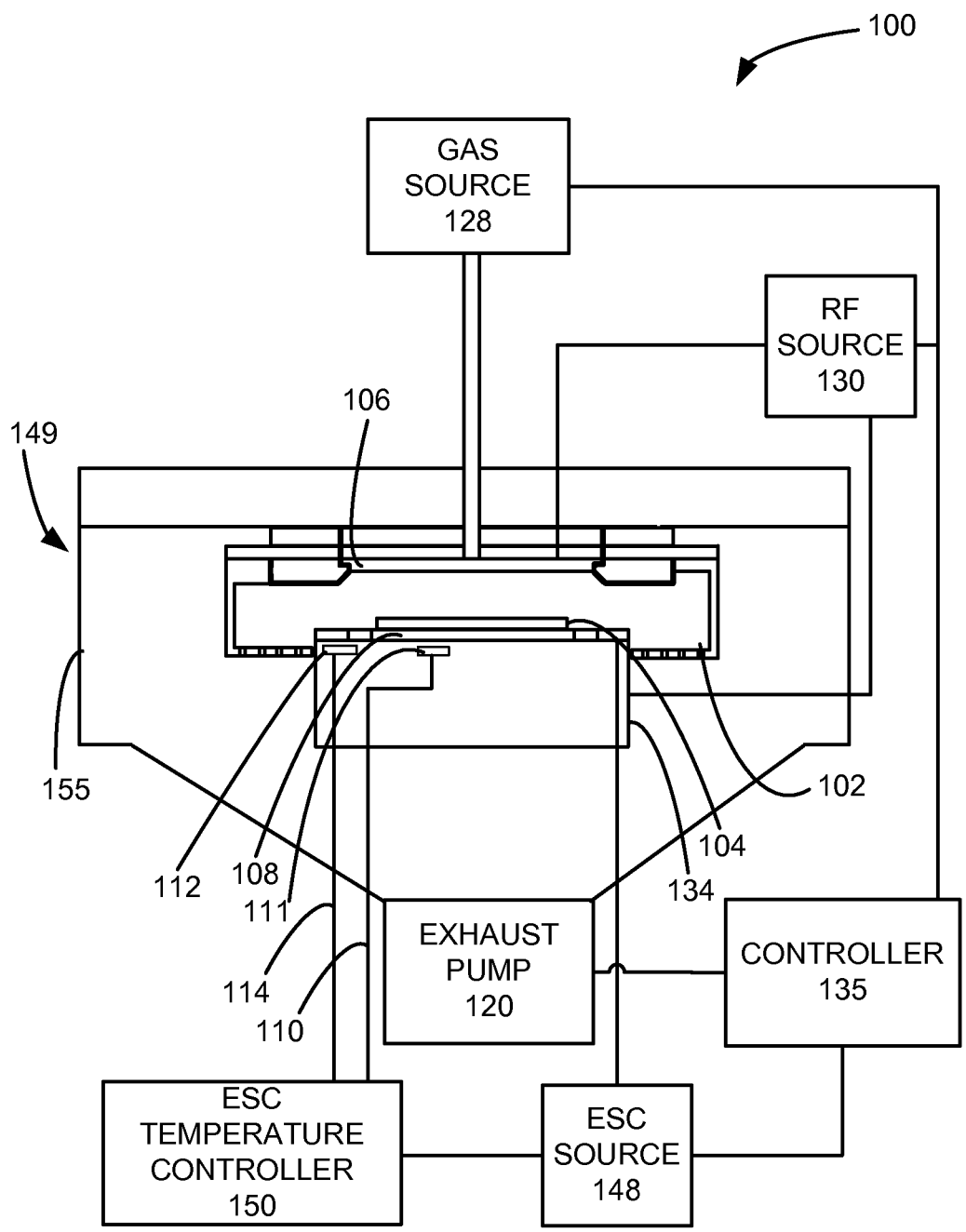
FIG. 1 is a schematic view of an etch reactor that may be used in an embodiment of the invention.

FIG. 1 is a schematic view of an etch reactor that may be used in an embodiment. In one or more embodiments of the invention, an etch reactor 100 comprises a gas distribution plate 106 providing a gas inlet and an ESC 108, within an etch chamber 149, enclosed by a chamber wall 155. Within the etch chamber 149, a substrate 104 on which a stack is formed is positioned on top of the ESC 108. The ESC 108 may provide a bias from the ESC source 148. A gas source 128 is connected to the etch chamber 149 through the distribution plate 106. An ESC temperature controller 150 is connected to the ESC 108, and provides temperature control of the ESC 108. In this example, a first connection 110 for providing power to an inner heater 111 for heating an inner zone of the ESC 108 and a second connection 114 for providing to an outer heater 112 for heating an outer zone of the ESC 108. An RF source 130 provides RF power to a lower electrode 134 and an upper electrode, which in this embodiment is the gas distribution plate 106. In this embodiment, the RF source 130 provides power at 2 MHz, 27 MHz, and 60 MHz. In this embodiment, the RF source 130 comprises three RF generators, with one generator at each frequency. In other embodiments, the generators may be in separate RF sources, or separate RF generators may be connected to different electrodes. For example, the upper electrode may have inner and outer electrodes connected to different RF sources. Other arrangements of RF sources and electrodes may be used in other embodiments.

Figure 2:
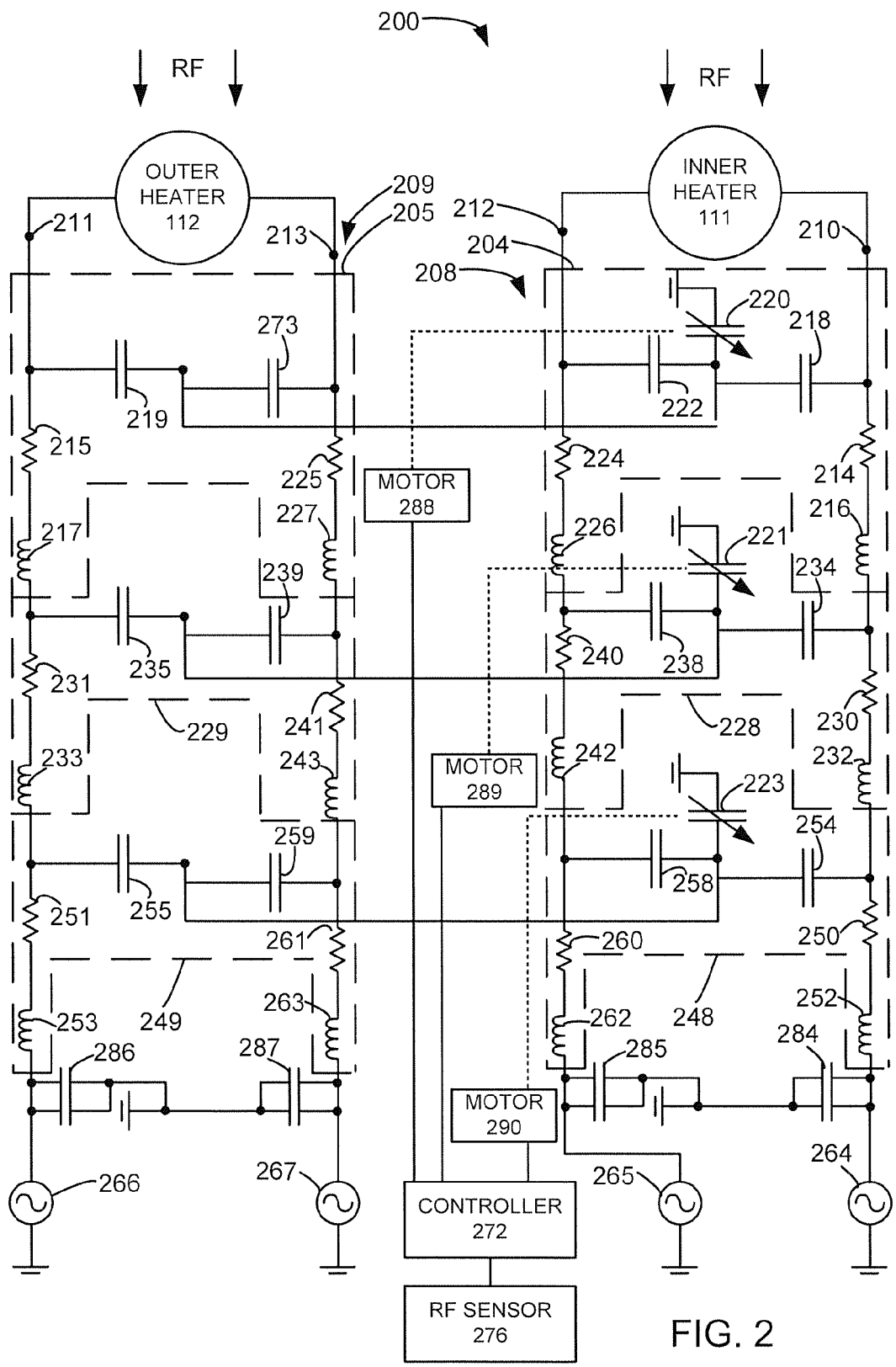
FIG. 2 is an electrical schematic of an embodiment of the invention.

Within the ESC temperature controller 150 is an RF filter. FIG. 2 is a schematic illustration of an electric heater system 200 with an inner heater 111 electrically connected to a RF filter system 208 and an outer heater 112 electrically connected to a RF filter system 209 used in the ESC temperature controller 150 in an embodiment of the invention. A first lead is electrically connected to a first voltage in terminal 210. A second lead is electrically connected to a first voltage out terminal 212. First ends of a first resister 214 and first inductor 216 are electrically connected in series to the first voltage in terminal 210. A first end of a first capacitor 218 is electrically connected to the first voltage in terminal 210 in parallel to the first resister 214 and the first inductor 216. A second end of the first capacitor 218 is electrically connected to a first end of a first variable capacitor 220 and a first end of a second capacitor 222 in series. The second end of the first variable capacitor 220 is grounded. A second end of the second capacitor 222 is electrically connected to the first voltage out terminal 212. First ends of a second resistor 224 and a second inductor 226 are connected in series to the first voltage out terminal 212. The first resistor 214, first inductor 216, first capacitor 218, first variable capacitor 220, second capacitor 222, second resistor 224, and second inductor 226 form a first RF filter 204 for a first frequency, which in this embodiment is approximately 60 MHz.

A first lead of the outer heater 112 is electrically connected to a second voltage in terminal 211. A second lead of the outer heater 112 is electrically connected to a second voltage out terminal 213. First ends of a third resister 215 and third inductor 217 are electrically connected in series to the second voltage in terminal 211. A first end of a third capacitor 219 is electrically connected to the second voltage in terminal 211 in parallel to the third resister 215 and the third inductor 217. A second end of the third capacitor 219 is electrically connected to a first end of the first variable capacitor 220 and a first end of a fourth capacitor 273 in series. A second end of the fourth capacitor 273 is electrically connected to the second voltage out terminal 213. First ends of a fourth resistor 225 and fourth inductor 227 are connected in series to the second voltage out terminal 213. The third resistor 215, third inductor 217, third capacitor 219, first variable capacitor 220, fourth capacitor 273, fourth resistor 225, and fourth inductor 227 form a second RF filter 205 for the first frequency, which in this embodiment is approximately 60 MHz.

A third RF filter 228 comprises a fifth resistor 230 and a fifth inductor 232 with first ends connected in series to the second end of the first inductor 216. A first end of a fifth capacitor 234 is electrically connected to the second end of the first inductor 216 in parallel to the fifth resister 230 and the fifth inductor 232. A second end of the fifth capacitor 234 is electrically connected to a first end of a second variable capacitor 221 and a first end of a sixth capacitor 238 in parallel. A second end of the sixth capacitor 238 is electrically connected to a second end of the second inductor 226. First ends of a sixth resistor 240 and a sixth inductor 242 are connected in series to the second end of the second inductor 226. The third RF filter 228 filters a second frequency, which in this embodiment is approximately 27 MHz.

A fourth RF filter 229 comprises a seventh resistor 231 and a seventh inductor 233 with first ends connected in series to the second end of the third inductor 217. A first end of an seventh capacitor 235 is electrically connected to the second end of the third inductor 217 in parallel to the seventh resister 231 and the seventh inductor 233. A second end of the seventh capacitor 235 is electrically connected to a first end of the second variable capacitor 221 and a first end of a eighth capacitor 239 in parallel. A second end of the eighth capacitor 239 is electrically connected to a second end of the fourth inductor 227. First ends of an eighth resistor 241 and an eighth inductor 243 are connected in series to the second end of the fourth inductor 227. The fourth RF filter 229 filters a second frequency, which in this embodiment is approximately 27 MHz.

A fifth RF filter 248 comprises a ninth resistor 250 and a ninth inductor 252 with first ends connected in series to the second end of the fifth inductor 232. A first end of a ninth capacitor 254 is electrically connected to the second end of the fifth inductor 232 in parallel to the ninth resister 250 and the ninth inductor 252. A second end of the ninth capacitor 254 is electrically connected to a first end of a third variable capacitor 223 and a first end of a tenth capacitor 258 in parallel. A second end of the tenth capacitor 258 is electrically connected to a second end of the sixth inductor 242. First ends of a tenth resistor 260 and a tenth inductor 262 are connected in series to the second end of the sixth inductor 242. The fifth RF filter 248 filters the third frequency, which in this embodiment is approximately 2 MHz.

A sixth RF filter 249 comprises an eleventh resistor 251 and an eleventh inductor 253 with first ends connected in series to the second end of the seventh inductor 233. A first end of an eleventh capacitor 255 is electrically connected to the second end of the seventh inductor 233 in parallel to the eleventh resister 251 and the eleventh inductor 253. A second end of the eleventh capacitor 255 is electrically connected to a first end of the third variable capacitor 223 and a first end of a twelfth capacitor 259 in parallel. A second end of the twelfth capacitor 259 is electrically connected to a second end of the eighth inductor 243. First ends of a twelfth resistor 261 and a twelfth inductor 263 are connected in series to the second end of the eighth inductor 243. The sixth RF filter 249 filters the third frequency, which in this embodiment is approximately 2 MHz.

The second end of the ninth inductor 252 is electrically connected to a first signal generator 264 and a first end of a first coupling capacitor 284. The second end of the tenth inductor 262 is electrically connected to a second signal generator 265 and a first end of a second coupling capacitor 285. The second end of the eleventh inductor 253 is electrically connected to a third signal generator 266 and a first end of a third coupling capacitor 286. The second end of the twelfth inductor 263 is electrically connected to a fourth signal generator 267 and a first end of a fourth coupling capacitor 287. In this embodiment the first, second, third, and fourth signal generators 264, 265, 266, 267 are grounded and form a power supply. A second end of the first coupling capacitor 284 is electrically connected to a second end of the second coupling capacitor 285 and ground. A second end of the third coupling capacitor 286 is electrically connected to a second end of the fourth coupling capacitor 287 and ground. A first motor 288 is controllably connected to the first variable capacitor 220. A second motor 289 is controllably connected to the second variable capacitor 221. A third motor 290 is controllably connected to the third variable capacitor 223. Generally, each variable capacitor is connected to a motor, so that the motors may independently control the variable capacitors. A controller 272 is controllably connected to the first, second, and third motors 288, 289, 290. An RF sensor 276 is electrically connected to the controller 272, which provides an indirect connection between the first, second and third motors 288, 289, 290 and the RF sensor 276.

Figure 3:
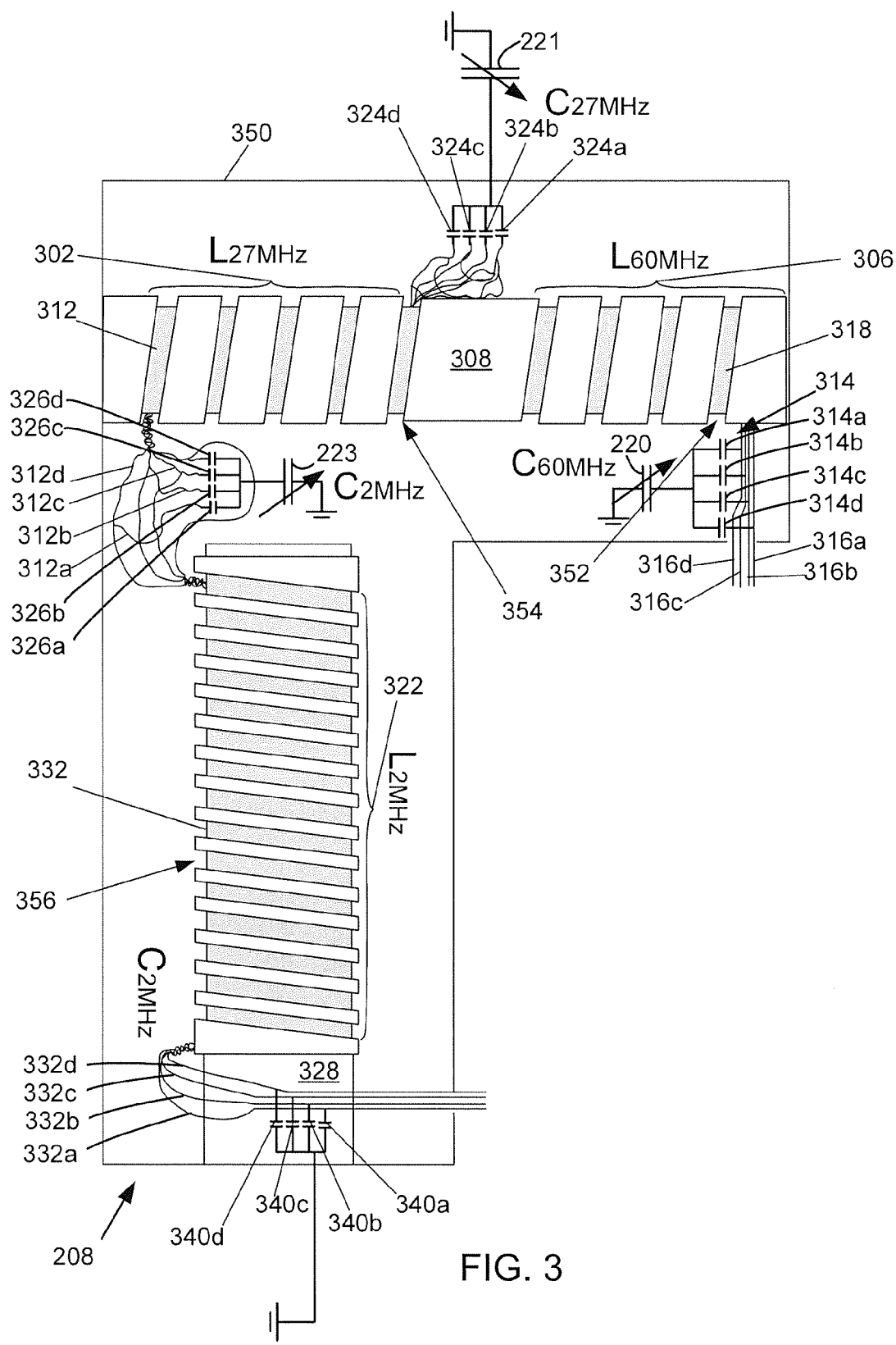
FIG. 3 is a view of an implementation of an embodiment of then invention.

FIG. 3 shows a schematic representation of an implementation of the RF filter system 208. The RF filter system 208 may include an enclosure 350 for housing at least some components of the RF filter system 208. This implementation also includes a core member 308 disposed inside enclosure 350 and securely coupled with enclosure 350 for providing structural support for inductors and capacitors. The RF filter system 208 also includes a plurality of grounded capacitors 314, including at least a capacitor 314a, a capacitor 314b, a capacitor 314c, and a capacitor 314d, at least for tuning impedances to reduce RF power loss from ESC 108 for improving on wafer performance, the plasma processing rate, for example, the etch rate. The RF filter system 208 also includes a cable 316 wound around and wound along at least a portion of core member 308 to form a set of inductors 306 having a set of inductances. Inductors in the set of inductors 306 and capacitors in the plurality of grounded capacitors 314 may form tuned circuits (or resonant circuits) to filter out or block RF power at a certain operating frequency (e.g., 60 MHz) transmitted from ESC 108.

In this embodiment, the cable 316 may include a plurality of wires, for example, coated magnet wires, such as solid double coated magnet copper wires. The plurality of wires may include a wire 316a and a wire 316b. Wire 316a is connected to the first voltage in terminal 210 and the capacitor 314a for forming a first resonant circuit. A second end of wire 316a may be connected to a power supply (e.g., an AC power supply) through other wires. A first end of wire 316b is connected to the first voltage out terminal 212 and the capacitor 314b for forming a second resonant circuit. A second end of wire 316b may be connected to the power supply through other wires. Wire 316a forms part of a first conductor for providing power from the first signal generator 264 to the inner heater 111. Wire 316b forms part of a second conductor for providing power from the second signal generator 265 to the inner heater 111.

The plurality of wires may further include a wire 316c and a wire 316d. A first end of wire 316c may be connected to the outer heater 112. A first end of wire 316c is connected to the second voltage in terminal 211 and capacitor 314c for forming a first resonant circuit. A second end of wire 316c may be connected to the third signal generator 266 through other wires. A first end of wire 316d is connected to the second voltage out terminal 213 and capacitor 314d for forming a second resonant circuit. A second end of wire 316d may be connected to the fourth signal generator 267 through other wires. Wire 316c forms part of a third conductor for providing power from the third signal generator 266 to the outer heater 112. Wire 316d forms part of a fourth conductor for providing power from the fourth signal generator 267 to the outer heater 112.

The resonant circuits formed by wires 316a-316d and capacitors 314a-314d may filter out RF power at a certain operating frequency (e.g., 60 MHz) leaked or transmitted from ESC 108.

In this embodiment, at least a portion of wire 316a, at least a portion of wire 316b, at least a portion of wire 316c, and at least a portion of wire 316d are twisted together to minimize the distances (or to minimize the effects of the distances) between the portion of wire 316a, the portion of wire 316b, the portion of wire 316c, and the portion of wire 316d. As a result, the differences between the stray capacitances associated with wires may be minimized; and the impedances associated with wires at the ESC 108 may be substantially equal. Advantageously, on each wafer processed in the plasma processing system, the plasma processing rates (e.g., etch rates) may be substantially uniform; the manufacturing yield may be maximized.

The core member 308 may include a positioning mechanism for positioning at least a portion of cable 316 and/or securing the portion of cable 316 in place according to specifications. For example, core member 308 may include a groove structure 352 (e.g., a helical groove structure) for positioning and/or securing at least a portion (e.g., a helical inductor portion) of cable 316. At least the portion of cable 316 may be disposed inside groove structure 352. Since core member 308 may be securely coupled with enclosure 350, movement of the portion of cable 316 relative to the walls of enclosure 350 may be prevented or minimized. Accordingly, the stray capacitances associated with the wires in cable 316 and the walls of enclosure 350 may be substantially constant. Advantageously, embodiments of the invention may provide substantially consistent plasma processing profiles (e.g., etching profiles) from wafer to wafer, from RF power filter to RF power filter, and/or from plasma processing chamber to plasma processing chamber, without requiring the skill-intensive, time-consuming calibration processes required in the prior art.

In this embodiment, wire 316a wrapped around the core 308 forms the first inductor 216. Wire 316b wrapped around the core 308 forms the second inductor 226. This allows the inductance of the first inductor 216 to be almost exactly equal to the inductance of the second inductor 226. As a result, capacitor 314a is the first capacitor 218 and capacitor 314b is the second capacitor 222, which are electrically connected to the first variable capacitor 220, as shown. The first and second resistors 214, 224 may be the resistance of wires 316a and 316b, or may be separate resistors or a combination of both. In this embodiment, wire 316a forms a fifth conductor and wire 316b forms a sixth conductor.

Wire 316c wrapped around the core 308 forms the third inductor 217. Wire 316d wrapped around the core 308 forms the fourth inductor 227. This allows the inductance of the first inductor 216, the second inductor 226, the third inductor 217, and the fourth inductor 227 to be almost exactly the same. Capacitor 314c is the third capacitor 219 and capacitor 314c is the fourth capacitor 273, which are electrically connected to the first variable capacitor 220, as shown. The third and fourth resistors 215, 225 may be the resistance of wires 316c and 316d, or may be separate resistors or a combination of both. In this embodiment, wire 316c forms a seventh conductor and wire 316b forms an eighth conductor.

For filtering out or blocking RF power at a second operating frequency (e.g., 27 MHz) transmitted from the ESC 108, the RF filter system 208 may further include a second plurality of grounded capacitors 324a-d, which are the fifth capacitor 234, the sixth capacitor 238, the seventh capacitor 235, and the eighth capacitor 239. Grounded capacitors 324a-d also may be implemented at least for tuning impedances to reduce RF power loss from the ESC 108 for improving the plasma processing rate. RF filter system 208 may also include a cable 312 wound around and wound along at least a portion of core member 308 to form a second set of inductors 302 having a second set of inductances. The second set of inductors includes the fifth inductor 232, the sixth inductor 242, the seventh inductor 233, and the eighth inductor 243. Inductors in the second set of inductors 302 and capacitors in the second plurality of capacitors 324a-d may form tuned circuits (or resonant circuits) to filter out or block RF power at the second operating frequency (e.g., 27 MHz) transmitted from ESC 108.

Cable 312 also may include a plurality of wires, for example, wire 312a, wire 312b, wire 312c, and wire 312d. A first end of wire 312a may be connected to capacitor 324a and may be connected to the second end of wire 316a; a second end of wire 312a may be connected to the first signal generator 264. Accordingly, similar to wire 316a, in addition to serving as an inductor, wire 312a may also serve as a section of the connection between the first signal generator 264 and the inner heater 111; wire 316a may be connected to the first signal generator 264 through at least wire 312a. A first end of wire 312b may be connected to capacitor 324b and may be connected to the second end of wire 316b; a second end of wire 312b may be connected to the second signal generator 265. Accordingly, similar to wire 316b, in addition to serving as an inductor, wire 312b may also serve as a section of the connection between a power supply and the inner heater 111. Wire 316a may be connected to the first signal generator 264 through at least wire 312b.

Core member 308 may also include a second positioning mechanism, such as a helical groove structure 354, for positioning at least a portion of cable 312 and/or securing the portion of cable 312 in place according to specifications. Similar to groove structure 352, groove structure 354 may prevent or minimize the movement of cable 312, for maintaining the consistency of plasma processing profiles from wafer to wafer, from RF power filter to RF power filter, and/or from plasma processing chamber to plasma processing chamber.

In this embodiment, wire 312a wrapped around the core 308 forms the fifth inductor 232. Wire 312b wrapped around the core 308 forms the sixth inductor 242. This allows the inductance of the fifth inductor 232 to be almost exactly equal to the inductance of the sixth inductor 242. As a result, capacitor 324a is the fifth capacitor 234 and capacitor 324b is the sixth capacitor 238. The fifth and sixth resistors 230, 240 may be the resistance of wire 312a and 312b, or may be separate resistors or a combination of both. In this embodiment, wire 312a forms a fifth conductor and wire 312b forms a sixth conductor.

Wire 312c wrapped around the core 308 forms the seventh inductor 233. Wire 312d wrapped around the core 308 forms the eighth inductor 243. This allows the inductance of the seventh inductor 233 to be almost exactly equal to the inductance of the eighth inductor 243. As a result, capacitor 324c is the seventh capacitor 235 and capacitor 324d is the eighth capacitor 239. The seventh and eighth resistors 231, 241 may be the resistance of wire 312c and 312d, or may be separate resistors or a combination of both.

For filtering out or blocking RF power at a third operating frequency (e.g., 2 MHz) transmitted from the ESC, this embodiment further includes a third plurality of grounded capacitors 326a-d also at least for tuning impedances to reduce RF power loss from the ESC 108 for improving the plasma processing rate. This embodiment may also include a cable 332 wound around form 328 forming a third set of inductors 322 having a third set of inductances. Inductors in the third set of inductors 322 and capacitors in the third plurality of capacitors 326a-d may form tuned circuits (or resonant circuits) to filter out or block RF power at the third operating frequency (e.g., 2 MHz) transmitted from the ESC 108.

In this embodiment, wire forming cable 332 wrapped around the core 308 form the ninth inductor 252, the tenth inductor 262, the eleventh inductor 253, and the twelfth inductor 263. This allows the inductance of the ninth inductor 252, the tenth inductor 262, the eleventh inductor 253, and the twelfth inductor 263 to be almost exactly equal. As a result, the plurality of capacitors 326a-d forms the ninth capacitor 254, the tenth capacitor 258, the eleventh capacitor 255, and the twelfth capacitor 259. The ninth, tenth, eleventh, and twelfth resistors 250, 260, 251, 261 may be the resistance of wires, or may be separate resistors or a combination of both. In this embodiment, wire 332a forms a ninth conductor, wire 332b forms a tenth conductor, wire 332c forms an eleventh conductor and wire 332d forms a twelfth conductor. The plurality of capacitors 340a-d forms the first coupling capacitor 284, the second coupling capacitor 285, the third coupling capacitor 286, and the fourth coupling capacitor 287.

Similar to wires in cable 316 and wires in cable 312, in addition to serving as inductors, wires in cable 332 may also serve as sections of the electrical connections between the signal generators and the heaters.

Similar to the configurations of wires in cable 316 and wires in cable 312 discussed above, at least portions of two or more of wires in cable 332 may be twisted together for achieving substantially uniform plasma processing rates on wafer processed in the plasma processing system.

Figure 4:
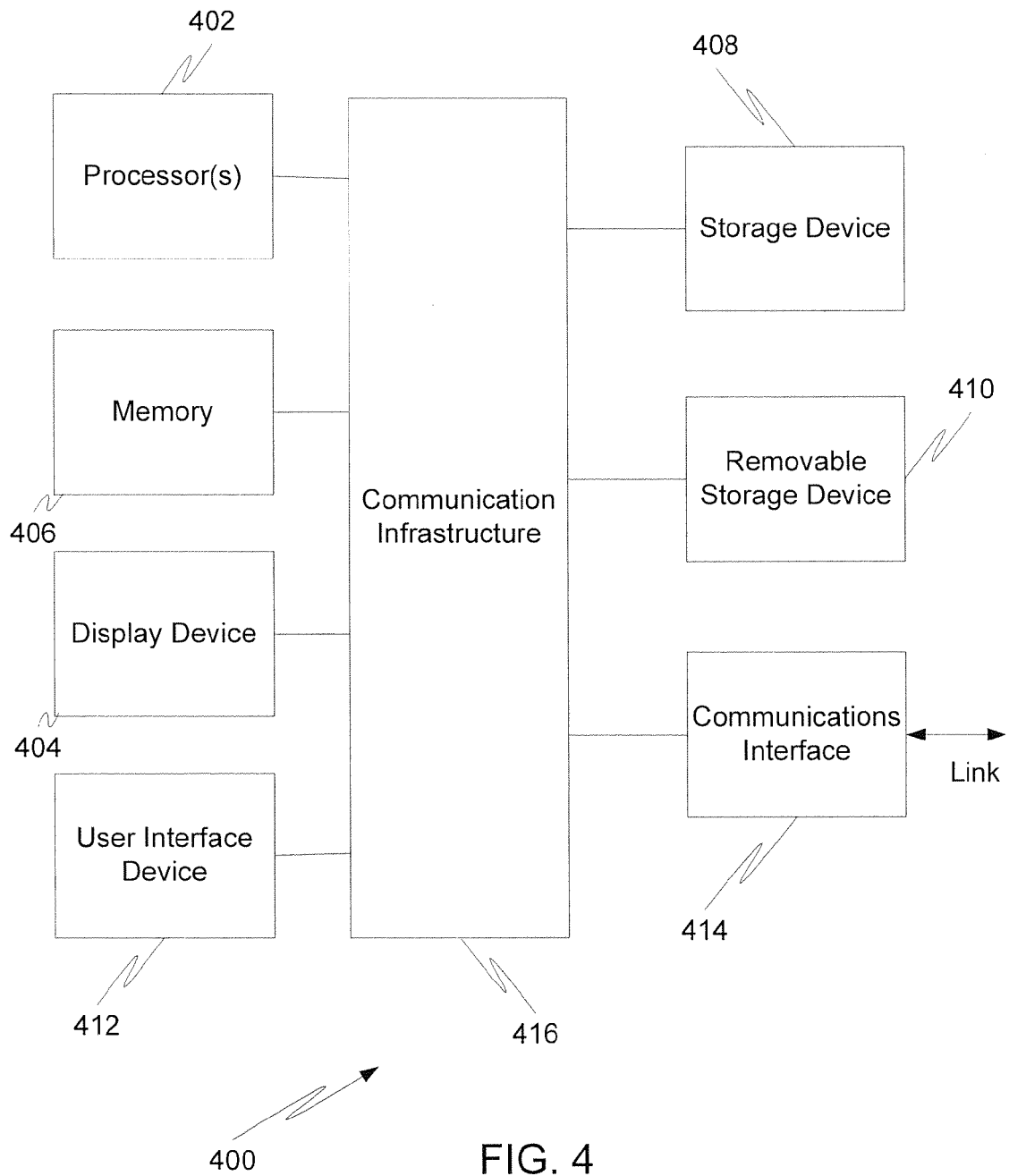
FIG. 4 illustrates a computer system, which is suitable for implementing a controller used in embodiments of the present invention.

FIG. 4 is a high level block diagram showing a computer system 400, which is suitable for implementing a controller 272 used in embodiments of the present invention. The computer system may have many physical forms ranging from an integrated circuit, a printed circuit board, and a small handheld device up to a huge super computer. The computer system 400 includes one or more processors 402, and further can include an electronic display device 404 (for displaying graphics, text, and other data), a main memory 406 (e.g., random access memory (RAM)), storage device 408 (e.g., hard disk drive), removable storage device 410 (e.g., optical disk drive), user interface devices 412 (e.g., keyboards, touch screens, keypads, mice or other pointing devices, etc.), and a communication interface 414 (e.g., wireless network interface). The communication interface 414 allows software and data to be transferred between the computer system 400 and external devices via a link. The system may also include a communications infrastructure 416 (e.g., a communications bus, cross-over bar, or network) to which the aforementioned devices/modules are connected.

Information transferred via communications interface 414 may be in the form of signals such as electronic, electromagnetic, optical, or other signals capable of being received by communications interface 414, via a communication link that carries signals and may be implemented using wire or cable, fiber optics, a phone line, a cellular phone link, a radio frequency link, and/or other communication channels. With such a communications interface, it is contemplated that the one or more processors 402 might receive information from a network, or might output information to the network in the course of performing the above-described method steps. Furthermore, method embodiments of the present invention may execute solely upon the processors or may execute over a network such as the Internet in conjunction with remote processors that shares a portion of the processing.

The term "non-transient computer readable medium" is used generally to refer to media such as main memory, secondary memory, removable storage, and storage devices, such as hard disks, flash memory, disk drive memory, CD-ROM and other forms of persistent memory and shall not be construed to cover transitory subject matter, such as carrier waves or signals. Examples of computer code include machine code, such as produced by a compiler, and files containing higher level code that are executed by a computer using an interpreter. Computer readable media may also be computer code transmitted by a computer data signal embodied in a carrier wave and representing a sequence of instructions that are executable by a processor.

The first, second, and third motors 288, 289, 290 provide motor linkage and motor control. The controller 272 provides multifrequency detection, computer frequency control, and movement commands based on input from the RF sensor 276, or frequency information provided by RF power source(s). The controller 272 takes input from RF sensors or RF power source to process frequency information and generate commands to the first, second, and third motors 288, 289, 290 to move the variable capacitors in such manner to produce a sufficient impedance at the operating frequencies such that RF power loss in filter system is minimized. The first, second, and third motors 288, 289, 290 can be of any type of motor including steppers, which are preferred due to lower cost and maintenance, DC or AC motors. The first, second, and third motors 288, 289, 290 can be also a linear actuated variable capacitor.

In operation, a substrate 104 is placed on the ESC 108. The gas source 128 provides a process gas. The RF source provides RF power, which may be used to form the process gas into a plasma and/or provide bias. In this embodiment the RF power is provided to the process gas by capacitive coupling at three frequencies of 60 MHz, 27 MHz, and 2 MHz. In other embodiments, inductive coupling or other methods may be used to provide the RF power to the process gas. The inner and outer heaters 111, 112 are also exposed to the RF power. The first, second, third, and fourth signal generators 264, 265, 266, 267 provide power to the inner and outer heaters 111, 112. The first RF filter 204 prevents 60 MHz RF power from leaking from the inner heater 111 out of the etch chamber 149. The second RF filter 205 prevents 60 MHz RF power from leaking from the outer heater 112 out of the etch chamber 149. The third RF filter 228 prevents 27 MHz RF power from leaking from the inner heater 111 out of the etch chamber 149. The fourth RF filter 229 prevents 27 MHz RF power from leaking from the outer heater 112 out of the etch chamber 149. The fifth RF filter 248 prevents 2 MHz RF power from leaking from the inner heater 111 out of the etch chamber 149. The sixth RF filter 249 prevents 2 MHz RF power from leaking from the outer heater 112 out of the etch chamber 149. The first, second, third, and fourth coupling capacitors 284, 285, 286, 287 are provided to complete the filtering of the 2 MHz RF power.

Preferably, the capacitors have a capacitance that is at least five times the maximum capacitance of the variable capacitor. More preferably, the capacitors have a capacitance that is at least ten times the maximum capacitance of the variable capacitor. Most preferably, the capacitors have a capacitance that is at least a hundred times the maximum capacitance of the variable capacitor. Since the capacitance of the capacitors is several times greater than the maximum capacitance of the variable capacitors, the variable capacitors are able to more finely tune the filtering circuit. This ratio determines channel to channel separations and range of tunability. Preferably the coupling capacitors have a capacitance that is larger in value than the capacitance of the other capacitor. More preferably, the coupling capacitors have a capacitance that is at least twice the capacitance of the other capacitors. Most preferably the coupling capacitors have at least five times the capacitance of the other capacitors.

By forming a power source using the first, second, third, and fourth signal generators 264, 265, 266, 267, the power source may provide power from the first, second, and fourth signal generators 264, 265, 266, 267 at different phases. For example, a three phase AC power source at 480 V and 47-63 Hz may be used where the first signal generator 264 may be at phase A, the second signal generator 265 may be at phase B, the third signal generator 266 may be at phase C, and the fourth signal generator 267 may be at either phase A or phase B. In another embodiment, a single phase system may be used, where the first signal generator 264 and the third signal generator 266 may be a first terminal of a single phase AC source and the second signal generator 265 and fourth signal generator 267 may be a second terminal of the single phase AC source, which may be ground.

This embodiment provides four channels in a single cable, using four wires, which in this embodiment are twisted together so that resulting inductances are nearly equivalent to allow the powering of two separate devices, heaters in this case. In other embodiments, the cables may have more than four channels to power more devices. In this embodiment, a single variable capacitor is used to tune four channels to a desired frequency to be filtered. This embodiment provides three sections for filtering a specific frequency for each channel where a variable capacitors is used to tune for a specific frequency for a particular section.

Figure 5:
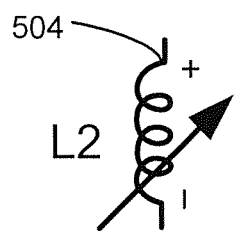
FIG. 5 is a schematic illustration of a variable inductor that is used in an embodiment of the invention.
Figure 6:
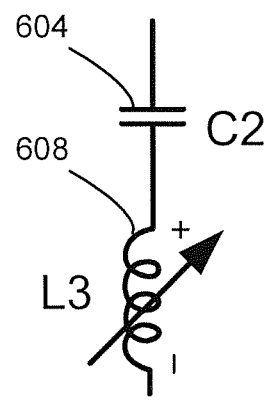
FIG. 6 is a schematic view of a variable component used in another embodiment of the invention.
Figure 7:
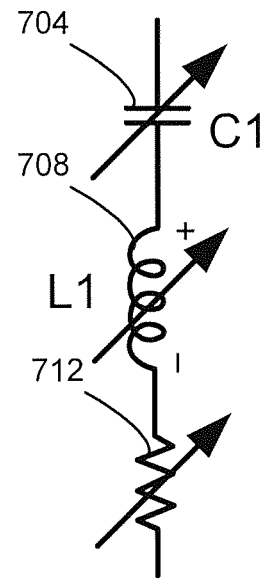
FIG. 7 is a schematic view of another variable component used in another embodiment of the invention.

In another embodiment the variable capacitors may be replaced by other variable components. FIG. 5 is a schematic illustration of a variable inductor 504, which is a variable component, which may replace a variable capacitor in an embodiment of the invention. FIG. 6 is a schematic illustration of a fixed capacitor 604 in series with a variable inductor 608, which form a variable component, which may replace a variable capacitor in another embodiment of the invention. FIG. 7 is a schematic illustration of a variable capacitor 704 in series with a variable inductor 708 in series with a variable resistor 712 which form a variable component, which may replace a variable capacitor in another embodiment of the invention. Other embodiments of the invention may use other combinations of variable components in series or parallel configurations to realize a certain shape, tunable filter Q or resonance frequency. A variable component is an electrical component with an electrical property that can be controllably changed to change the filter Q or resonance frequency of a circuit that the variable component is part of. Variable components also include electronically controlled variable components such as an electronically controlled capacitor such as a varactor or varicap diode.

In most application Q of a filter is kept high for effective attenuation. However there are applications where a low Q may be desired by adding resistive loss R1 below. This technique does not affect the power delivery of low frequency AC power source to devices (such as heaters in this case) but will reduce the high frequency Q of the adjacent circuits.

In another manifestation of the invention, the first, second, third, fourth, fifth, and sixth capacitors 218, 222, 219, 273, 234, 238, 235, 239, 254, 258, 255, 259 may be replaced by variable capacitors to provided additional channel matching.

While this invention has been described in terms of several preferred embodiments, there are alterations, permutations, modifications, and various substitute equivalents, which fall within the scope of this invention. It should also be noted that there are many alternative ways of implementing the methods and apparatuses of the present invention. It is therefore intended that the following appended claims be interpreted as including all such alterations, permutations, and various substitute equivalents as fall within the true spirit and scope of the present invention.

What is claimed is:

1. A RF filter system for filtering radio frequency (RF) power transmitted from at least an electrostatic chuck (ESC) in a plasma processing system, said plasma processing system including at least a first load disposed at a first portion of said ESC, said plasma processing system further including at least a power supply, said RF filter system comprising:
   a first core member;
   a first plurality of capacitors, said first plurality of capacitors comprising at least a first capacitor and a second capacitor;
   a first conductor;
   a second conductor, wherein first portions of the first conductor and second conductor are wound around and wound along at least a first portion of said first core member to form at least a first set of inductors comprising a first inductor formed from the first conductor and a second inductor formed from the second conductor, a first end of said first conductor being connected to a first end of said first load and to a first end of said first capacitor and a second end of said first conductor being electrically connected to said power supply, wherein a first end of said second conductor being connected to a second end of said first load and a second end of said second capacitor, and wherein a second end of said second conductor being electrically connected to said power supply; and
   a first variable component with a first end connected to ground, and a second end connected to a second end of said first capacitor and a first end of said second capacitor.

2. The RF filter system, as recited in claim 1, further comprising a first motor for controlling the first variable component.

3. The RF filter system, as recited in claim 2, further comprising a RF sensor controllably connected to the first motor.

4. The RF filter system, as recited in claim 3, wherein said plasma processing system further includes at least a second load disposed at a second portion of said ESC, wherein the first plurality of capacitors further comprises a third capacitor and a fourth capacitor;
   a third conductor; and
   a fourth conductor, wherein first portions of the third conductor and the fourth conductor are wound around and wound along at least said first portion of said first core member to form a third inductor formed from the third conductor and a fourth inductor formed from the fourth conductor, wherein a first end of said third conductor being connected to a first end of said second load and a first end of said third capacitor and wherein a second end of said third conductor being connected to said power supply and wherein a first end of said fourth conductor being connected to a second end of said second load and a second end of said fourth capacitor and wherein a second end of said fourth conductor being connected to said power supply and wherein the second end of the first variable component is connected to a second end of said third capacitor and a first end of said fourth capacitor.

5. The RF filter system, as recited in claim 4, further comprising:
   a second core;
   a second plurality of capacitors, comprising a fifth capacitor, a sixth capacitor, a seventh capacitor, and an eighth capacitor;
   a fifth conductor;
   a sixth conductor;
   a seventh conductor; and
   an eighth conductor wherein portions of the fifth, sixth, seventh, and eight conductors are wound around the second core forming a second set of inductors comprising a fifth inductor formed from the fifth conductor, a sixth inductor formed from the sixth conductor, a seventh inductor formed from the seventh conductor wound around the second core, and an eighth inductor formed by the eighth conductor wound around the second core, wherein the fifth conductor has a first end electrically connected to the second end of the first conductor and a first end of the fifth capacitor and a second end electrically connected to said power supply, wherein the first conductor is electrically connected to said power supply through the fifth conductor, and wherein the sixth conductor has a first end electrically connected to the second end of the second conductor and a second end of the sixth capacitor and a second end electrically connected to said power supply, wherein the second conductor is electrically connected to said power supply through the sixth conductor, and wherein the seventh conductor has a first end electrically connected to the second end of the third conductor and a first end of the seventh capacitor and a second end electrically connected to said power supply, wherein the third conductor is electrically connected to said power supply through the seventh conductor, and wherein the eighth conductor has a first end electrically connected to the second end of the fourth conductor and a second end of the eighth capacitor and a second end electrically connected to said power supply, wherein the fourth conductor is electrically connected to said power supply through the eighth conductor; and
   a second variable component electrically connected to the second ends of the fifth and seventh capacitors and connected to the first ends of the sixth and eighth capacitors.

6. The RF filter system, as recited in claim 5, further comprising:
   a third core;
   a third plurality of capacitors, comprising a ninth capacitor, a tenth capacitor, an eleventh capacitor, and a twelfth capacitor;
   a ninth conductor;
   a tenth conductor;
   an eleventh conductor; and a twelfth conductor wherein portions of the ninth, tenth, eleventh, and twelfth conductors are wound around the third core forming a third set of inductors comprising a ninth inductor formed from the ninth conductor, a tenth inductor formed from the tenth conductor, an eleventh inductor formed from the eleventh conductor, and a twelfth inductor formed by the twelfth conductor wound around the third core, wherein the ninth conductor has a first end electrically connected to the second end of the fifth conductor and a first end of the ninth capacitor and a second end electrically connected to said power supply, wherein the first conductor and fifth conductor are electrically connected to said power supply through the ninth conductor, and wherein the tenth conductor has a first end electrically connected to the second end of the sixth conductor and a first end of the tenth capacitor and a second end electrically connected to said power supply, wherein the second and sixth conductors are electrically connected to said power supply through the tenth conductor, and wherein the eleventh conductor has a first end electrically connected to the second end of the seventh conductor and a first end of the eleventh capacitor and a second end electrically connected to said power supply, wherein the third and seventh conductors are electrically connected to said power supply through the eleventh conductor, and wherein the twelfth conductor has a first end electrically connected to the second end of the eighth conductor and a second end of the twelfth capacitor and a second end electrically connected to said power supply, wherein the fourth and eighth conductors are electrically connected to said power supply through the twelfth conductor; and a third variable component electrically connected to second ends of the ninth and eleventh capacitor and first ends of the tenth and twelfth capacitors.

7. The RF filter system, as recited in claim 6, wherein at least a section the first, second, third, and fourth conductors are twisted together.

8. The RF filter system, as recited in claim 7, wherein the first variable component is a first variable capacitor, the second variable component is a second variable capacitor, and the third variable component is a third variable capacitor.

9. The RF filter system, as recited in claim 8, wherein each of the first plurality of capacitors has a capacitance at least five times a maximum capacitance provided by the first variable capacitor.

10. The RF filter system, as recited in claim 9, wherein each of the first plurality of capacitors has a capacitance at least ten times a maximum capacitance provided by the first variable capacitor.

11. The RF filter system, as recited in claim 8, wherein each of the first plurality of capacitors has a capacitance at least 100 times a maximum capacitance provided by the first variable capacitor.

12. The RF filter system, as recited in claim 1, wherein said plasma processing system further includes at least a second load disposed at a second portion of said ESC, wherein the first plurality of capacitors further comprises a third capacitor and a fourth capacitor;

a third conductor; and
a fourth conductor, wherein first portions of the third conductor and the fourth conductor are wound around and wound along at least said first portion of said first core member to form a third inductor formed from the third conductor and a fourth inductor formed from the fourth conductor, wherein a first end of said third conductor being connected to a first end of said second load and a first end of said third capacitor and wherein a second end of said third conductor being connected to said power supply and wherein a first end of said fourth conductor being connected to a second end of said second load and a second end of said fourth capacitor and wherein a second end of said fourth conductor being connected to said power supply and wherein the second end of the first variable component is connected to a second end of said third capacitor and a first end of said fourth capacitor.

13. The RF filter system, as recited in claim 12, further comprising:

a second core;
a second plurality of capacitors, comprising a fifth capacitor, a sixth capacitor, a seventh capacitor, and an eighth capacitor;
a fifth conductor;
a sixth conductor;
a seventh conductor;
an eighth conductor wherein portions of the fifth, sixth, seventh, and eight conductors are wound around the second core forming a second set of inductors comprising a fifth inductor formed from the fifth conductor, a sixth inductor formed from the sixth conductor, a seventh inductor formed from the seventh conductor wound around the second core, and an eighth inductor formed by the eighth conductor wound around the second core, wherein the fifth conductor has a first end electrically connected to the second end of the first conductor and a first end of the fifth capacitor and a second end electrically connected to said power supply, wherein the first conductor is electrically connected to said power supply through the fifth conductor, and wherein the sixth conductor has a first end electrically connected to the second end of the second conductor and a second end of the sixth capacitor and a second end electrically connected to said power supply, wherein the second conductor is electrically connected to said power supply through the sixth conductor, and wherein the seventh conductor has a first end electrically connected to the second end of the third conductor and a first end of the seventh capacitor and a second end electrically connected to said power supply, wherein the third conductor is electrically connected to said power supply through the seventh conductor, and wherein the eighth conductor has a first end electrically connected to the second end of the fourth conductor and a second end of the eighth capacitor and a second end electrically connected to said power supply, wherein the fourth conductor is electrically connected to said power supply through the eighth conductor; and a second variable component electrically connected to the second ends of the fifth and seventh capacitors and connected to the first ends of the sixth and eighth capacitors;
a third core;
a third plurality of capacitors, comprising a ninth capacitor, a tenth capacitor, an eleventh capacitor, and a twelfth capacitor;
a ninth conductor;
a tenth conductor;
an eleventh conductor; and
a twelfth conductor wherein portions of the ninth, tenth, eleventh, and twelfth conductors are wound around the third core forming a third set of inductors comprising a ninth inductor formed from the ninth conductor, a tenth inductor formed from the tenth conductor, an eleventh inductor formed from the eleventh conductor, and a twelfth inductor formed by the twelfth conductor wound around the third core, wherein the ninth conductor has a first end electrically connected to the second end of the fifth conductor and a first end of the ninth capacitor and a second end electrically connected to said power supply, wherein the first conductor and fifth conductor are electrically connected to said power supply through the ninth conductor, and wherein the tenth conductor has a first end electrically connected to the second end of the sixth conductor and a first end of the tenth capacitor and a second end electrically connected to said power supply, wherein the second and sixth conductors are electrically connected to said power supply through the tenth conductor, and wherein the eleventh conductor has a first end electrically connected to the second end of the seventh conductor and a first end of the eleventh capacitor and a second end electrically connected to said power supply, wherein the third and seventh conductors are electrically connected to said power supply through the eleventh conductor, and wherein the twelfth conductor has a first end electrically connected to the second end of the eighth conductor and a second end of the twelfth capacitor and a second end electrically connected to said power supply, wherein the fourth and eighth conductors are electrically connected to said power supply through the twelfth conductor; and a third variable component electrically connected to second ends of the ninth and eleventh capacitor and first ends of the tenth and twelfth capacitors.

14. The RF filter system, as recited in claim 13, wherein at least a section of the first, second, third, and fourth conductors are twisted together.

15. The RF filter system, as recited in claim 14, wherein the first variable component is a first variable capacitor, the second variable component is a second variable capacitor, and the third variable component is a third variable capacitor.

16. A RF filter system for filtering radio frequency (RF) power transmitted from a load and between the load and a power supply, said filter comprising:

a first resistor with a first end and a second end, wherein the first end of the first resistor is electrically connected to a first terminal of the load;

a first inductor with a first end and a second end wherein the first end of the first inductor is electrically connected to a second end of the first resistor;

a first capacitor with a first end electrically connected to the first end of the first resistor and the first terminal of the load;

a second resistor with a first end and a second end, wherein the first end of the second resistor is electrically connected to a second terminal of the load;

a second inductor with a first end and a second end wherein the first end of the second inductor is electrically connected to a second end of the second resistor;

a second capacitor with a second end electrically connected to the first end of the second resistor and the second terminal of the load; and a first variable component with a first end connected to ground, and a second end connected to the second end of said first capacitor and a first end of said second capacitor.

17. The RF filter system, as recited in claim 16, further comprising a first motor for controlling the first variable component.

18. The RF filter system, as recited in claim 17, further comprising a RF sensor controllably connected to the first motor.

19. The RF filter system, as recited in claim 18, wherein the first variable component is a first variable capacitor.

* * * * *